(12) United States Patent
Takeuchi et al.

(10) Patent No.: US 8,441,799 B2
(45) Date of Patent: May 14, 2013

(54) ELECTRONIC COMPONENT AND ELECTRONIC DEVICE

(75) Inventors: Hitoshi Takeuchi, Chiba (JP); Keiji Sato, Chiba (JP); Kiyoshi Aratake, Chiba (JP); Masashi Numata, Chiba (JP); Takahiko Nakamura, Chiba (JP); Daisuke Terada, Chiba (JP); Takeshi Sugiyama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 336 days.

(21) Appl. No.: 12/759,417

(22) Filed: Apr. 13, 2010

(65) Prior Publication Data

US 2010/0290201 A1 Nov. 18, 2010

(30) Foreign Application Priority Data

| May 13, 2009 | (JP) | ................................. 2009-116886 |
| May 13, 2009 | (JP) | ................................. 2009-116887 |
| May 13, 2009 | (JP) | ................................. 2009-116888 |

(51) Int. Cl.
*H05K 1/00* (2006.01)
*H05K 1/18* (2006.01)
*H05K 7/00* (2006.01)

(52) U.S. Cl.
USPC ........................................................ 361/748

(58) Field of Classification Search .................. 361/752, 361/795, 794, 748, 743; 174/255, 260, 261, 174/262, 263
See application file for complete search history.

(56) References Cited

U.S. PATENT DOCUMENTS

| 5,041,943 | A | * | 8/1991 | Ilardi et al. ..................... 361/720 |
| 5,381,042 | A | * | 1/1995 | Lerner et al. .................. 257/712 |
| 5,477,081 | A | * | 12/1995 | Nagayoshi .................... 257/678 |
| 5,883,425 | A | * | 3/1999 | Kobayashi .................... 257/678 |
| 6,313,411 | B1 | * | 11/2001 | Budnaitis ...................... 174/255 |
| 6,770,822 | B2 | * | 8/2004 | Pasternak et al. ............. 174/260 |
| 7,015,583 | B2 | * | 3/2006 | Ishii et al. ..................... 257/772 |
| 7,154,046 | B2 | * | 12/2006 | Chung ........................... 174/259 |
| 7,382,204 | B2 | * | 6/2008 | Arai et al. ....................... 331/69 |
| 7,825,742 | B2 | * | 11/2010 | Lee et al. ....................... 331/158 |
| 7,842,887 | B2 | * | 11/2010 | Sakamoto et al. ............. 174/260 |
| 8,129,838 | B2 | * | 3/2012 | Reinert ......................... 257/710 |
| 2004/0159462 | A1 | * | 8/2004 | Chung ........................... 174/259 |

(Continued)

FOREIGN PATENT DOCUMENTS

| JP | 2006-197278 A | 7/2006 |
| JP | 2007-528591 T | 10/2007 |
| WO | WO 2004/106221 A2 | 12/2004 |

*Primary Examiner* — Lisa Lea Edmonds
*Assistant Examiner* — Xanthia C Cunningham
(74) *Attorney, Agent, or Firm* — Brinks Hofer Gilson & Lione

(57) ABSTRACT

To provide an improved solderability for mounting an electronic component onto a circuit board, a package of an electronic component (1) is formed by bonding together a base (3) made of glass and a lid (2). Outer electrodes (8) and (18) are formed on a bottom surface of the base (3), and the outer electrodes (8) and (18) are respectively connected to through electrodes (7) and (17). The outer electrodes (8) and (18) each have a laminated structure of three CrAu layers, that is, from a Cr layer (first layer) to an Au layer (sixth layer). When the outer electrodes (8) and (18) are soldered onto a circuit board, the Au layers as the second, fourth, and sixth layers are dissolved into solder, whereas the Cr layers as the third and fifth layers, which hardly form an intermetallic compound with solder, are separated to remain in solder.

14 Claims, 8 Drawing Sheets

U.S. PATENT DOCUMENTS

| | | |
|---|---|---|
| 2005/0258913 A1* | 11/2005 | Ito et al. ..................... 331/158 |
| 2006/0151877 A1* | 7/2006 | Yamashita et al. ............ 257/737 |
| 2006/0267702 A1* | 11/2006 | Neumann ..................... 331/176 |
| 2007/0108634 A1* | 5/2007 | Higashi et al. ................ 257/787 |
| 2007/0268675 A1* | 11/2007 | Chinda et al. ................. 361/748 |
| 2008/0017407 A1* | 1/2008 | Kawano ........................ 174/260 |
| 2008/0164488 A1* | 7/2008 | Ikeda et al. ..................... 257/99 |
| 2008/0230585 A1* | 9/2008 | Shinkai et al. ............. 228/122.1 |
| 2008/0265717 A1* | 10/2008 | Iizuka et al. .................. 310/348 |
| 2009/0025789 A1* | 1/2009 | Chan et al. .................... 136/259 |
| 2009/0079053 A1* | 3/2009 | Huang .......................... 257/679 |
| 2009/0175022 A1* | 7/2009 | Kwon et al. .................. 361/820 |
| 2009/0196789 A1* | 8/2009 | Kobayashi et al. ........... 420/555 |
| 2009/0211796 A1* | 8/2009 | Chinda et al. ................. 174/260 |

* cited by examiner

| Electrode film structure | Thickness of Au layer [nm] | Strength (index) |
|---|---|---|
| Cr60-Au75 | 75 | 1.3 |
| Cr60-Au150 | 150 | 1.0 |
| Cr60-Au300 | 300 | 1.8 |
| Cr60-Au450 | 450 | 3.2 |
| Cr60-Au900 | 900 | 2.9 |
| Cr60-Au150 (3 layers) | | 2.1 |

| Electrode specifications | Strength (index) |
|---|---|
| Cr60-Au150 × 1 layer | 1.0 |
| Cr60-Au150 × 2 layers | 1.9 |
| Cr60-Au150 × 3 layers | 2.1 |

| Electrode specifications (nm) | Indentation | | |
|---|---|---|---|
| | 1mm | 2mm | 3mm |
| Cr60-Au150 × 3 layers | 0/20 | 0/20 | 0/20 |
| Cr60-Cu10500-Sn10000 | 1/5 | 4/5 | 4/5 |
| Cr60-Cu500-Ni2000-Sn10000 | 0/5 | 2/5 | 4/5 |

ELECTRONIC COMPONENT AND ELECTRONIC DEVICE

RELATED APPLICATIONS

This application claims priority under 35 U.S.C. §119 to Japanese Patent Application Nos. 2009-116886, 2009-116887, and 2009-116888 all filed on May 13, 2009, the entire contents of which are hereby incorporated by reference.

BACKGROUND OF THE INVENTION

1. Field of the Invention

The present invention relates to an electronic component, a manufacturing method for an electronic component, and an electronic device, and to, for example, an electronic component, a manufacturing method for an electronic component, and an electronic device having improved solderability for mounting an electronic component onto a circuit board.

2. Description of the Related Art

Some electronic elements, such as crystal resonators and semiconductors, are made available after being enclosed in packages. Each package has outer electrodes formed thereon, and the outer electrodes are soldered onto a circuit board so that an electronic element may be electrically and physically connected to the circuit board on a package basis.

FIG. 16 is an explanatory view of a conventional outer electrode 108. The outer electrode 108 has a three-layered structure of, for example, Cr, Ni, and Au. The Cr layer has good adhesive properties on glass constituting a base 103 of a package. The Cr layer is thus formed on a bottom surface of the base 103. Formed on a surface of the Cr layer is the Ni layer for forming an intermetallic compound with Sn, which is a main component of solder. Further, formed on a surface of the Ni layer is the Au layer for preventing oxidation of Ni.

When the outer electrode 108 structured as described above is soldered onto electrodes of a circuit board, the Au layer is dissolved into the solder, and part of Ni formed on the Au layer side forms an intermetallic compound layer with Sn in the solder. The remaining Ni layer (if exist), which does not form an intermetallic compound with Sn, and the Cr layer are bonded to the circuit board through the intermediation of the intermetallic compound layer and the solder. Such a technology of using Cr in the case where a base material is glass has been proposed in each of JP 2007-528591 A and JP 2006-197278 A.

In JP 2007-528591 A, in the case where a base material is glass or the like, a Cr layer is formed as an adhesive layer. JP 2006-197278 A has proposed a technology of forming on glass an outer electrode with a two-layered thin film of Cr and Au, or a CrNi alloy and Au. On the other hand, in a case where a base material is not glass, there is known another technology of forming an outer electrode with a base layer of Ni and a surface layer of Au applied thereover for preventing oxidation, or with a base layer of Cu and a layer of Sn formed thereon.

Incidentally, the application of heat during solder bonding allows Sn contained in solder (or in an electrode coating) to form an intermetallic compound layer with Cu or Ni. The intermetallic compound layer is brittle compared with a base material, and hence has a problem of being prone to crack when applied with an external force. In addition, the intermetallic compound layer grows when heated to high temperature, and hence if the Ni layer or the Cu layer completely reacts with Sn in the solder, solder joint strength is reduced, which poses a problem that the Ni layer or the Cu layer needs to have a certain degree of thickness. If the technology of JP 2006-197278 A is utilized to form a two-layered thin film of Cr and Au as a structure containing no Ni layer, there arises a problem that solder joint strength becomes insufficient depending on a thickness of the Au layer. Further, in a case of a glass-made base, there is another problem that, as the Ni layer or the Cu layer becomes thickened, stress during the formation (plating) and stress of the film itself become so large that resistance to board bending may become insufficient.

SUMMARY OF THE INVENTION

It is an object of the present invention to provide improved solderability for mounting an electronic component onto a circuit board.

In order to solve the above-mentioned object, one aspect of the present invention provides an electronic component including: an electronic element; a housing case for housing the electronic element in a hollow portion defined inside the housing case; via electrodes that are electrically connected to electrodes of the electronic element, the via electrodes being formed from an inside of the housing case to an outside of the housing case; and outer electrodes that are electrically connected to the via electrodes, the outer electrodes being formed on a bottom surface of the housing case, in which the outer electrodes are each formed by including: a first metal layer that is formed on the bottom surface of the housing case and is to be soldered to electrodes of a circuit board; a second metal layer that is formed on a surface of the first metal layer and is to be dissolved into solder; and a third metal layer that is formed on a surface of the second metal layer and is to be hardly dissolved into solder.

According to the one aspect of the present invention, the outer electrodes are each formed by further including: a fourth metal layer that is formed on a surface of the third metal layer and is to be dissolved into solder; and a fifth metal layer that is formed on a surface of the fourth metal layer and is to be hardly dissolved into solder.

According to the one aspect of the present invention, the outer electrodes each further include an anti-oxidation film formed as an outermost surface layer.

According to the one aspect of the present invention, the housing case is formed of glass.

According to the one aspect of the present invention, the electronic element includes a crystal resonator.

One aspect of the present invention provides a manufacturing method for an electronic component, including: an electronic element installing step of installing, on a base, an electronic element and via electrodes for wiring to be electrically connected to electrodes of the electronic element; an enclosing step of bonding a lid to the base on which the electronic element and the via electrodes are installed, to thereby enclose the electronic element in a housing case including the base and the lid; and an outer electrode forming step of: forming, on a bottom surface of the housing case, a first metal layer that is to be soldered to; forming, on a surface of the first metal layer, a second metal layer that is to be dissolved into solder; and forming, on a surface of the second metal layer, a third metal layer that is to be hardly dissolved into solder, to thereby form an outer electrode.

According to the present invention, in each of the outer electrodes, a metal layer that is to be hardly dissolved into solder is formed on a metal layer that is to be dissolved into solder, to thereby improve solderability after mounting onto a circuit board.

In order to solve the above-mentioned object, another aspect of the present invention provides an electronic component including: an electronic element; a housing case for housing the electronic element in a hollow portion defined inside the housing case; via electrodes that are electrically connected to electrodes of the electronic element, the via electrodes being formed from an inside of the housing case to an outside of the housing case; a metal film for bonding that is electrically connected to one of the via electrodes and is to be soldered to electrodes of a circuit board, the metal film for bonding being formed on a bottom surface of the housing case; and an anti-oxidation film that is formed on a surface of the metal film for bonding, in which the anti-oxidation film includes at least one gold layer having a total thickness of 300 nm or more and 1,000 nm or less, and the at least one gold layer has an uppermost surface bonded to the metal film for bonding.

According to the another aspect of the present invention, the total thickness of the at least one gold layer is 300 nm or more and 450 nm or less.

According to the another aspect of the present invention, the anti-oxidation film includes: a plurality of the gold layers; and a predetermined metal layer that is formed between the plurality of the gold layers.

According to the another aspect of the present invention, the predetermined metal layer is made of a metal that is hardly dissolved into solder.

According to the another aspect of the present invention, the anti-oxidation film includes the at least one gold layer formed as a single layer.

According to the another aspect of the present invention, the housing case is formed of glass.

According to the another aspect of the present invention, the electronic element includes a crystal resonator.

Another aspect of the present invention provides a manufacturing method for an electronic component, including: an electronic element installing step of installing, on a base, an electronic element and via electrodes for wiring to be electrically connected to electrodes of the electronic element; an enclosing step of bonding a lid to the base on which the electronic element and the via electrodes are installed, to thereby enclose the electronic element in a housing case including the base and the lid; a metal film for bonding forming step of forming, on a bottom surface of the housing case, a metal film for bonding that is to be soldered to; and an anti-oxidation film forming step of forming, on a surface of the formed metal film for bonding, an anti-oxidation film that includes at least one gold layer having a total thickness of 300 nm or more and 1,000 nm or less, the at least one gold layer having an uppermost surface bonded to the formed metal film for bonding.

According to the present invention, a total thickness of the gold layers of the anti-oxidation film is limited, to thereby improve solderability after mounting of an electronic component onto a circuit board.

In order to solve the above-mentioned object, still another aspect of the present invention provides an electronic device including: an electronic element; a housing case for housing the electronic element in a hollow portion defined inside the housing case; via electrodes that are electrically connected to electrodes of the electronic element, the via electrodes being formed from an inside of the housing case to an outside of the housing case; an electrode metal layer that is electrically connected to one of the via electrodes, the electrode metal layer being formed on a bottom surface of the housing case; a joint that is bonded to the electrode metal layer without forming an intermetallic compound layer of Sn between the joint and the electrode metal layer; and a circuit board on which other electronic elements are mounted and to which the joint is bonded.

According to the still another aspect of the present invention, the electrode metal layer is made of a metal selected from the group consisting of Cr, Ti, Mo, W, and Ta.

According to the still another aspect of the present invention, the joint contains in a mixed state at least one metal selected from the group consisting of Cr, Ti, Mo, W, and Ta.

According to the still another aspect of the present invention, the electrode metal layer is made of the same metal as the at least one metal contained in the joint in the mixed state.

According to the still another aspect of the present invention, the joint contains Au.

According to the present invention, an intermetallic compound layer is absent at the interface between the electrode metal layer and the joint, and hence there may be obtained an electronic device with high solderability after mounting on an electronic component onto a circuit board.

DETAILED DESCRIPTION OF THE PREFERRED EMBODIMENT (1) Summary of Embodiment

An electronic device has electronic elements installed therein. Outer electrodes are formed on a bottom surface of a glass package that houses the electronic element therein. The outer electrodes each include an electrode metal layer that is bonded to a glass-made base, and a surface layer that is formed on a surface of the electrode metal layer. The electrode metal layer is made of a metallic element, such as chromium (Cr), titanium (Ti), molybdenum (Mo), tungsten (W), or tantalum (Ta), which has good adhesive properties on glass and hardly forms a compound with solder (whose main component is tin (Sn)) under a temperature range for use. The surface layer is made of a metal, such as gold (Au), silver (Ag), or palladium (Pd), which resists oxidation under a temperature range for use, and easily dissolves into liquid solder in soldering.

It is revealed through an experiment described later that, when an outer electrode formed of such an electrode metal layer and a surface layer as described above is soldered, excellent shear strength is obtained in a solder joint surface. In addition, when the outer electrode is soldered, a solder joint with the outer electrode is allowed to contain Sn and a metal of the surface layer.

It is further revealed through another experiment described later that, when a metallic element that hardly forms a compound with solder (the same metallic element as the one forming the electrode metal layer) is contained in the surface layer, excellent shear strength and bending resistance are obtained in the solder joint surface. If an outer electrode formed of such an electrode metal layer and a surface layer as describe above is soldered, there may be obtained an electronic device with high solderability after mounting.

Figure 1:
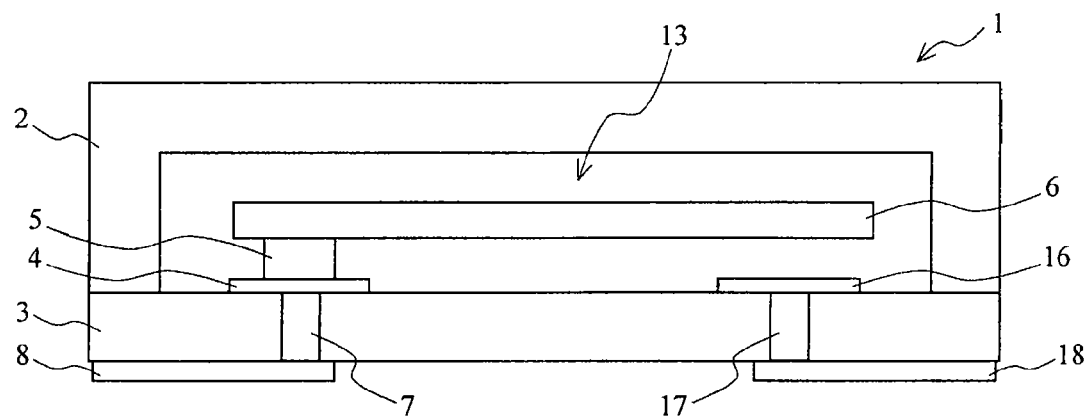
FIG. 1 is a cross-sectional view of an electronic component.
Figure 2:
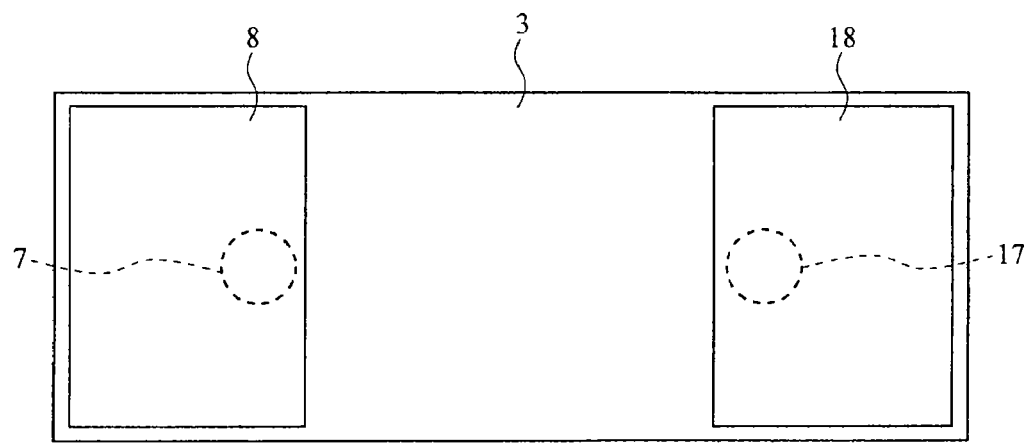
FIG. 2 is a bottom view of the electronic component.
Figure 3:
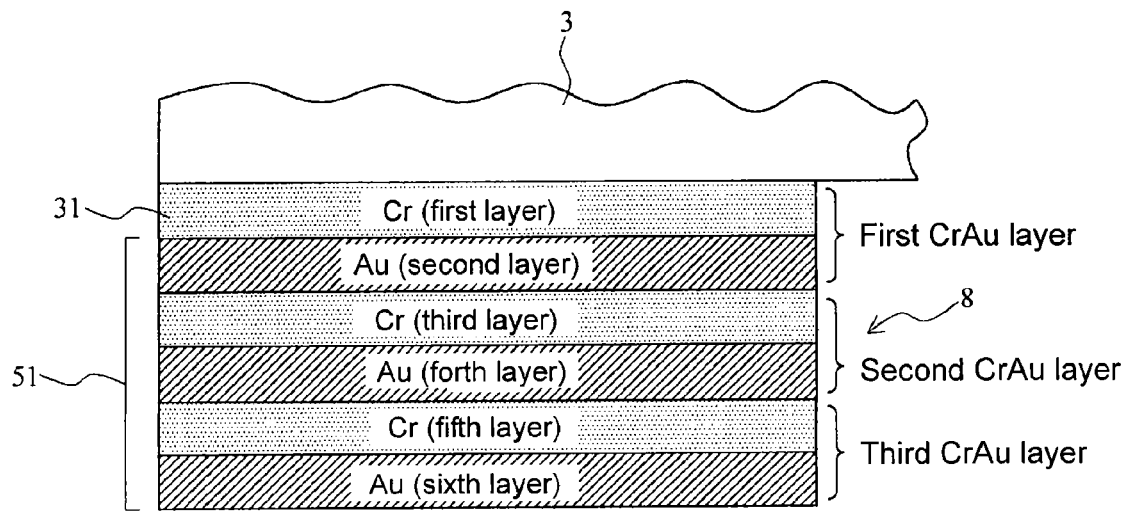
FIG. 3 is a cross-sectional view of an outer electrode of the electronic component.

FIGS. 1 to 3 illustrate an example of such a mode as described above in which a metallic element that hardly forms a compound with solder is contained in the surface layer. An electronic component 1 (FIG. 1) includes a crystal resonator 6 disposed in a hollow portion 13 that is defined by a base 3 and a lid 2. The base 3 is formed of glass that has through electrodes 7 and 17 formed therein. Formed on a bottom surface of the base 3 are outer electrodes 8 and 18 that are electrically connected to electrodes of the crystal resonator 6 via the through electrodes 7 and 17, respectively.

The base 3 is formed of glass. The outer electrode 8 (FIG. 3) includes an electrode film for bonding 31 (corresponding to the electrode metal layer), which is to be soldered to electrodes of a circuit board in soldering and is formed of Cr having good adhesive properties on glass, and an anti-oxidation film 51 (corresponding to the surface layer), which is formed on a surface of the electrode film for bonding 31 (on a lower surface thereof, that is, an opposite side to the electrode film for bonding 31). The anti-oxidation film 51 has a structure in which Au layers and Cr layers are alternately laminated so that the uppermost surface among the Au layers may be bonded to the electrode film for bonding 31. In other words, the outer electrode 8 has a laminated structure of three CrAu layers, that is, from the Cr layer (first layer) to the Au layer (sixth layer). The outer electrode 18 has the same structure.

When the outer electrode 8 is soldered onto a circuit board 36 (FIG. 7), the Au layers forming the anti-oxidation film 51 are dissolved and dispersed into solder 33 (FIG. 8), whereas the Cr layers of the anti-oxidation film 51 are not dissolved but exist in the solder 33 in a mixed state because the Cr layer hardly forms an intermetallic compound with Sn, which is a component of solder. In other words, the Au layers as the second, fourth, and sixth layers are dissolved into the solder, whereas the Cr layers as the third and fifth layers, which hardly form an intermetallic compound with solder, are separated and dispersed into the solder, and perhaps mingled and dispersed away into the solder in the course of dissolution of underlain metal layer. As a result, the outer electrodes 8 and 18 after the soldering exhibit high shear strength and bending resistance. It is expected that such effects result from the Cr layers becoming fine-grained when mixed or contained in the solder.

When the outer electrode 8 is soldered in this way, the anti-oxidation film 51 is dissolved into the solder 33, and then the electrode film for bonding 31 is directly bonded to the solder 33. According to this embodiment, the solder 33 and the electrode film for bonding 31 are bonded to each other with no intermetallic compound of Ni and Sn or the like being formed therebetween. Therefore, a problem of brittleness caused by an intermetallic compound layer may be avoided. The experiments described later reveal that solderability after mounting of the electronic component 1 onto the circuit board 36 may be improved. It is further revealed through the experiment described later that, also in a case where the anti-oxidation film 51 is formed only of Au (in a case where the surface layer contains no metallic element that hardly forms a compound with solder), excellent shear strength is obtained in a solder joint surface as long as the Au layer has a thickness falling within a predetermined range.

A total thickness value of the Au layers forming the anti-oxidation film 51 is set to 300 [nm] or more and 1,000 [nm] or less, preferably 300 [nm] or more and 450 [nm] or less. With this setting, a thickness sufficient enough to effectively prevent oxidation of the electrode film for bonding 31 is ensured while preventing solder from becoming brittle due to an excessive amount of Au.

Because the anti-oxidation film 51 effectively prevents oxidation of the electrode film for bonding 31, sufficient bonding strength may be ensured even if the outer electrode 8 is soldered in air. In addition, because the Au layer is directly formed on the electrode film for bonding 31 that is formed of Cr, there is no need to use a metal layer of Ni or the like, which produces an intermetallic compound with solder. Note that the anti-oxidation film 51 has a multi-layer structure of the Au layers and the Cr layers in the example of FIG. 3, but may be structured with a single Au layer.

(2) Details of Embodiment

FIG. 1 illustrates the electronic component 1 according to this embodiment, illustrating a cross-sectional view of when the electronic component 1 is to be bonded to a circuit board, as being observed in a direction parallel to a surface of the circuit board. FIG. 2 is a bottom view of the electronic component 1. Note that, for the simplification of the drawing, FIG. 2 illustrates the through electrodes 7 and 17 as being exaggerated in diameter compared with those of FIG. 1. Hereinafter, one side of the electronic component 1 facing the circuit board in mounting is referred to a "bottom surface side", while another side thereof opposite to the one side is referred to a "top surface side".

The electronic component 1 includes the base 3, the lid 2, a support member 5, the crystal resonator 6, inner electrodes 4 and 16, the through electrodes 7 and 17, the outer electrodes 8 and 18, and the like. The crystal resonator 6 is an electronic element formed of, for example, a tuning fork crystal resonator, and its tuning fork base is supported by the support member 5. Although not illustrated, electrodes are placed on tuning fork arms of the crystal resonator 6. When the electrodes are supplied with a predetermined pulse, the crystal resonator 6 may oscillate at a predetermined frequency.

In order that the tuning fork arms of the crystal resonator 6 may oscillate within the hollow portion 13, the crystal resonator 6 is supported by the support member 5 in a cantilever manner so as to keep a predetermined attitude toward the base 3. Note that this embodiment employs the crystal resonator 6 as an example of an electronic element, but may employ another electronic element, such as a semiconductor.

The base 3 is, for example, a plate-like member formed of glass, and has a top surface attached with the crystal resonator 6 supported by the support member 5. Used as a material of the base 3 is, for example, soda-lime glass, which has advantages of being inexpensive and capable of anodic bonding. The base 3 has a thickness of, for example, about 0.05 to 2 [mm], preferably about 0.1 to 0.5 [mm]. As the alternative to soda-lime glass, borosilicate glass, alkali-free glass, crystallized glass, or the like may be used. Further, strengthened soda-lime glass may be used as well.

At top surface portions of the base 3, the inner electrodes 4 and 16 are formed to be electrically connected to the electrodes of the crystal resonator 6. In addition, the base 3 has through holes formed therein so as to pass through the base 3 from the top surface portions to bottom surface portions thereof. The through electrodes 7 and 17 are formed in the through holes. The inner electrodes 4 and 16 and the through electrodes 7 and 17 are electrically connected to each other, respectively.

The lid 2 is formed of glass or metal, and a surface of its central portion facing the base 3 is contoured with a recess portion for housing the crystal resonator 6 therein. In the case where the lid 2 is formed of metal, a metal whose coefficient of linear expansion is approximate to that of glass is desirably used for the lid 2. The recess portion of the lid 2 has a recessed amount of, for example, about 0.05 to 1.5 [mm], and may be processed by etching, sandblasting, hot pressing, laser processing, or the like.

The opening of the lid 2 is bonded to the base 3 through anodic bonding or by using a bonding material. The top surface of the base 3 and the recess portion of the lid 2 together define the hollow portion 13 for housing the crystal resonator 6 therein. Note that the alternatives to anodic bonding, which is employed as a method involving bonding together the base 3 and the lid 2, include direct bonding, metal bonding, bonding using low-melting glass, brazing, welding, and soldering with high-melting solder. In addition, an intermediate material may be used between the base 3 and the lid 2.

The hollow portion 13 is hermetically enclosed with the lid 2 and the base 3 so as to be isolated from the outside air. For example, the hollow portion 13 is maintained in a vacuum state or sealed with a predetermined gas to obtain airtight sealing. Note that, in the electronic component 1, the hollow portion 13 is defined by forming the recess portion in the lid 2, but may be defined by forming a recess portion in the base 3 and bonding together the thus formed base 3 and the flat plate-like lid 2. Still alternatively, the hollow portion 13 may be defined by forming recess portions in both the lid 2 and the base 3.

As described above, in the electronic component 1, the electronic element is housed in such a package of the glass case formed of the base 3 and the lid 2. If the package is formed of glass, a material cost becomes inexpensive, and trimming, bonding, or gettering may be performed on the crystal resonator 6 with a laser beam from the outside on the bottom surface side of the electronic component 1. Here, gettering refers to a technology for increasing the degree of vacuum in vacuum sealing through the application of a laser beam to an Al pattern, which is disposed in a space, so that the Al pattern may be heated to allow ambient air (oxygen) to react with Al to be consumed.

The outer electrode 8 is a bonding portion formed of metal films that is to be electrically and mechanically bonded to an electrode land on the circuit board with solder or the like. The outer electrode 8 is formed on the bottom surface of the base 3, and electrically connected to the through electrode 7. The outer electrode 18 is structured similarly to the outer electrode 8 so as to be electrically connected to the through electrode 17.

Note that, in the electronic component 1, it is the through electrodes 7 and 17 that electrically connect the electrodes of the crystal resonator 6 to the outer electrodes 8 and 18, but there may be employed, for example, the following structure. That is, the inner electrodes 4 and 16 are respectively drawn out of the electronic component 1 via the bonded portions between the lid 2 and the base 3, and further the drawn inner electrodes 4 and 16 are formed so as to extend from side surfaces to bottom surface of the base 3. Then, the inner electrodes 4 and 16 are electrically connected to the outer electrodes 8 and 18 on the bottom surface of the base 3. In this structure, there is no need to form the through electrodes 7 and 17 in the base 3.

FIG. 3 illustrates a detailed structure of the outer electrode 8. The outer electrode 8 includes a first layer made of Cr that is formed on the surface of the base 3, a second layer made of Au that is formed on a surface of the first layer, a third layer made of Cr that is formed on a surface of the second layer, a fourth layer made of Au that is formed on a surface of the third layer, a fifth layer made of Cr that is formed on a surface of the fourth layer, and a sixth layer made of Au that is formed on a surface of the fifth layer.

In other words, there are formed three CrAu layers, each of which has the Au layer formed on the surface of the Cr layer, that is, a first CrAu layer, a second CrAu layer, and a third CrAu layer in order of from the base 3 side. The Cr layer as the first layer, which constitutes the uppermost layer, serves as an adhesive layer with respect to glass of the base 3. The Au layer as the sixth layer, which constitutes the outermost surface layer, serves as a protective film for preventing oxidation. In the electronic component 1, a CrAu layer is repeatedly laminated three times to obtain a three-layered structure by way of example, and it is preferable that a CrAu layer be repeatedly laminated twice or more to obtain a two- or more-layered structure.

Cr has good adhesive properties on glass, and hence the Cr layer is formed as the first layer on the surface of the base 3. Cr has properties of hardly forming an intermetallic compound with solder (whose main component is Sn). Au has properties of producing an intermetallic compound (alloy) of $AuSn_2$, $AuSn_4$, or the like to be more dissolved into solder in soldering.

Cr neither forms an intermetallic compound with solder nor is dissolved into solder. Au forms an intermetallic compound with solder, and hence is dissolved into solder. Therefore, the outer electrode 8 has the structure in which the layers made of a metallic element that neither forms an intermetallic compound with solder nor is dissolved into solder and the layers made of a metallic element that forms an intermetallic compound with solder and is more dissolved in solder are alternately laminated. Note that the second, fourth, and sixth layers do not necessarily need to form an intermetallic compound with solder as long as those layers are more dissolved in solder.

The outer electrode 8 uses Cr as a metallic element that hardly forms a compound with solder, but may use another metallic element, such as Ti, Mo, W, or Ta. Further, Au is used as a metallic element that is more dissolved into solder, but another metallic element, such as Ag or Pd, may be used. Then, the outer electrode 8 may be formed in a combination of metals in such a manner that the first, second, third, fourth, fifth, and sixth layers are formed of, for example, Cr, Au, Ti, Ag, W, and Au, respectively.

In other words, the outer electrode 8 includes the electrode film for bonding 31, which is formed on the surface of the base 3, and the anti-oxidation film 51, which prevents the electrode film for bonding 31 from oxidation. The electrode film for bonding 31 is made of a metallic element, such as Cr, which has good adhesive properties on glass and hardly forms an intermetallic compound with Sn, which is a main component of solder, (is hardly dissolved into solder) under a temperature range for use. As the alternative to Cr of the material of the electrode film for bonding 31, Ti, Mo, W, or Ta is available.

The anti-oxidation film 51 is formed by alternately laminating three layers of a metallic element that resists oxidation under a temperature range for use and less dissolves into the electrode film for bonding 31 while more dissolves into solder in soldering, such as Au layers (Au produces an intermetallic compound (alloy) such as $AuSn_2$ or $AuSn_4$ to be more dissolved into solder in soldering), and two layers of a metallic element that hardly forms an intermetallic compound with solder, such as Cr layers. The uppermost layer among the Au layers is bonded to the electrode film for bonding 31. Note that, in place of the Au layer, an Ag layer or a Pd layer may be used as the layer of a metallic element that dissolves into solder in soldering.

The anti-oxidation film 51 is formed using a plurality of the Au layers, and a total thickness value of those Au layers is set to, for example, 300 [nm] or more to 1,000 [nm] or less, preferably 300 [nm] or more to 450 [nm] or less. In the example of FIG. 3, the Au layers have an equal thickness, but the Au layers do not necessarily need to have an equal thickness as long as the total thickness value of the Au layers falls within the above-mentioned range of value. It is revealed from results of the experiment described later that, if the total thickness value of the Au layers is set within the above-mentioned range, excellent shear strength and the like are obtained after soldering.

As described above, the electrode film for bonding 31 may be formed of a single film of a metal selected from the group consisting of Cr, Ti, Mo, W, and Ta. The anti-oxidation film 51 may be formed of a metal film that is obtained by alternately laminating a single or a plurality of layers of metals selected from the group consisting of Cr, Ti, Mo, W, and Ta, and a single or a plurality of layers of metals selected from the group consisting of Au, Ag, and Pd. Note that it is desirable that a metal layer constituting the surface of the anti-oxidation film 51 be an Au layer, which is resistant to oxidation.

Metals constituting the electrode film for bonding 31 and the anti-oxidation film 51 may be arbitrarily selected. In a case where the same metal (for example, Cr) is selected for both the layer of the electrode film for bonding 31 and the layers of the anti-oxidation film 51 that are to be formed of a metallic element that hardly produces an intermetallic compound with solder, and where the same metal (for example, Au) is selected for all the layers of the anti-oxidation film 51 that are to be formed of a metallic element that is more dissolved in solder, it is only necessary to alternately laminate the two kinds of metal layers on the base 3, which facilitates its manufacture and reduces its manufacturing cost.

Further, in a case where the inner electrodes 4 and 16 are each formed by laminating a Cr layer and an Au layer, the inner electrodes 4 and 16 and the outer electrode 8 may be manufactured using the same apparatus. Still further, in a case where the Cr layer of each of the inner electrodes 4 and 16, the Cr layer of the electrode film for bonding 31, and the Cr layers of the anti-oxidation film 51 are set to have the same film thickness, and where the Au layer of each of the inner electrodes 4 and 16 and the Au layers of the anti-oxidation film 51 are set to have the same film thickness, there is no need to change conditions in the apparatus, which further improves manufacturing efficiency to increase productivity.

Each of those layers constituting the outer electrode 8 may be formed by, for example, a sputtering method involving sputtering in which a film (thin film) of a corresponding metallic element is formed on the bottom surface of the base 3. Specifically, the first layer (electrode film for bonding 31) of a Cr thin film is formed on the bottom surface of the base 3 by the sputtering method, and the second layer of an Au thin film is subsequently formed on a surface of the Cr thin film by the sputtering method. After that, this process is repeatedly performed twice to thereby form the outer electrode 8. Note that, in a case where each of the layers has a thickness of a certain degree or more, a plating method may be employed to form the each of the layers. The above description is directed to the outer electrode 8, and the outer electrode 18 has the same structure.

The electronic component 1 having the structure described above may be manufactured as follows. The through holes are formed in the base 3, and the through electrodes 7 and 17 are formed in the through holes. Then, the crystal resonator 6 is installed above the base 3 so as to be connected to the through electrodes 7 and 17. After that, the lid 2 is bonded to the base 3 through anodic bonding or the like, to thereby form the package.

Then, each of the layers constituting the outer electrode 8 is formed by, for example, a sputtering method involving sputtering in which a film of a corresponding metallic element is formed on the bottom surface of the base 3. Specifically, the electrode film for bonding 31 of Cr is formed on the bottom surface of the base 3, and subsequently Au films and Cr films are alternately formed thereon. Alternatively, a plating method may be employed to form the each of the layers. The electronic component 1 is completed in this way.

Note that the process order may be changed in such a manner that, for example, the lid 2 is bonded to the base 3 after the outer electrodes 8 and 18 have been formed on the base 3. Alternatively, there may be employed the following structure. That is, the through electrodes 7 and 17 and the crystal resonators 6 are installed on a base wafer capable of producing a large number of dies of the bases 3, and the base wafer is bonded to a lid wafer capable of producing a large number of dies of the lids 2, to thereby form a wafer on which a large number of electronic components 1 are formed. Then, the outer electrodes 8 and 18 are formed, and after that, the thus formed wafer is cut to produce a large number of dies of the electronic components 1.

Figure 4:
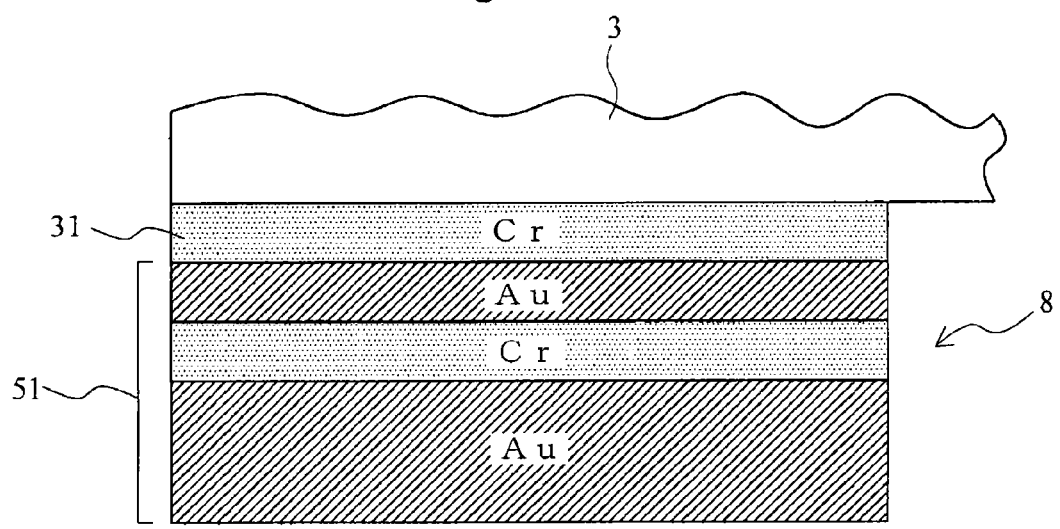
FIG. 4 is an explanatory view of one of various modification examples of an anti-oxidation film.
Figure 5:
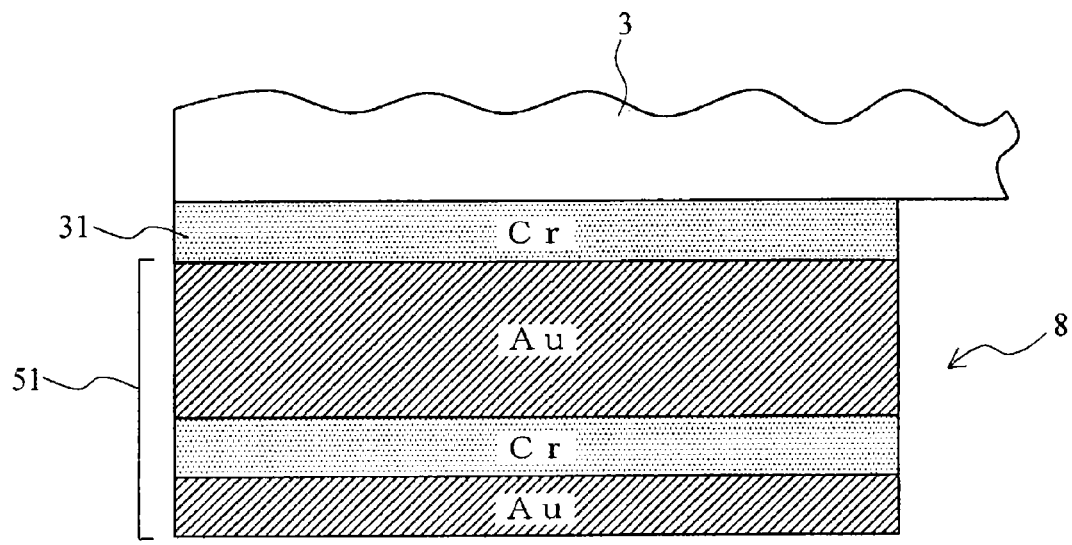
FIG. 5 is an explanatory view of another one of the various modification examples of the anti-oxidation film.
Figure 6:
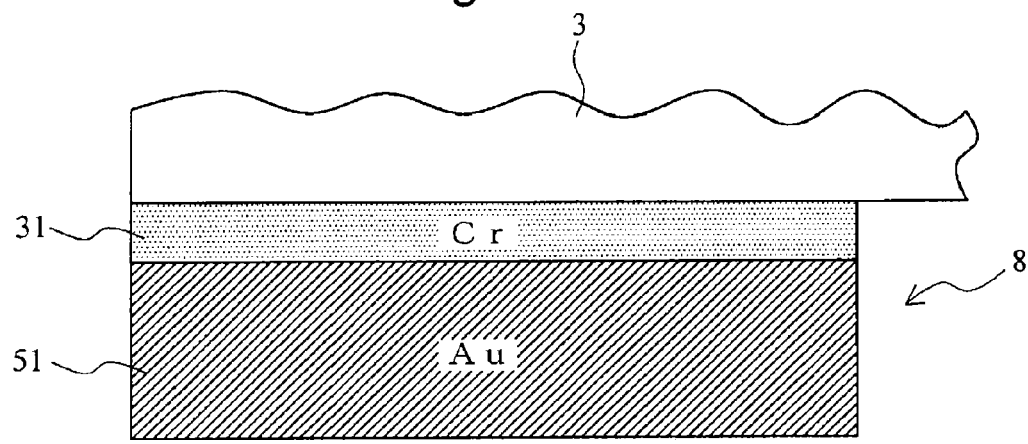
FIG. 6 is an explanatory view of still another one of the various modification examples of the anti-oxidation film.

FIGS. 4 to 6 are explanatory views of various modification examples of the anti-oxidation film 51. FIG. 4 is an example of the anti-oxidation film 51 in which a single Cr layer is formed between two Au layers, illustrating an example in which the Au layer formed under the Cr layer is larger in thickness than the Au layer formed on the Cr layer. A total thickness of those Au layers is set to, for example, 300 [nm] or more and 1,000 [nm] or less, preferably 300 [nm] or more and 450 [nm] or less.

FIG. 5 is another example of the anti-oxidation film 51 in which a single Cr layer is formed between two Au layers, illustrating an example in which the Au layer formed under the Cr layer is smaller in thickness than the Au layer formed on the Cr layer. A total thickness of those Au layers is set to, for example, 300 [nm] or more and 1,000 [nm] or less, preferably 300 [nm] or more and 450 [nm] or less. In each of the examples of FIG. 4 and FIG. 5, the two Au layers have different thicknesses, but may be formed to have the same thickness.

FIG. 6 is an example in which the anti-oxidation film 51 is formed of a single Au layer, and a thickness of the Au layer is set to, for example, 300 [nm] or more and 1,000 [nm] or less, preferably 300 [nm] or more and 450 [nm] or less. This example shows a case where the anti-oxidation film 51 does not contain a metallic element that hardly forms an intermetallic compound with solder, but is formed only of a metallic element that is more dissolved into solder.

Figure 7:
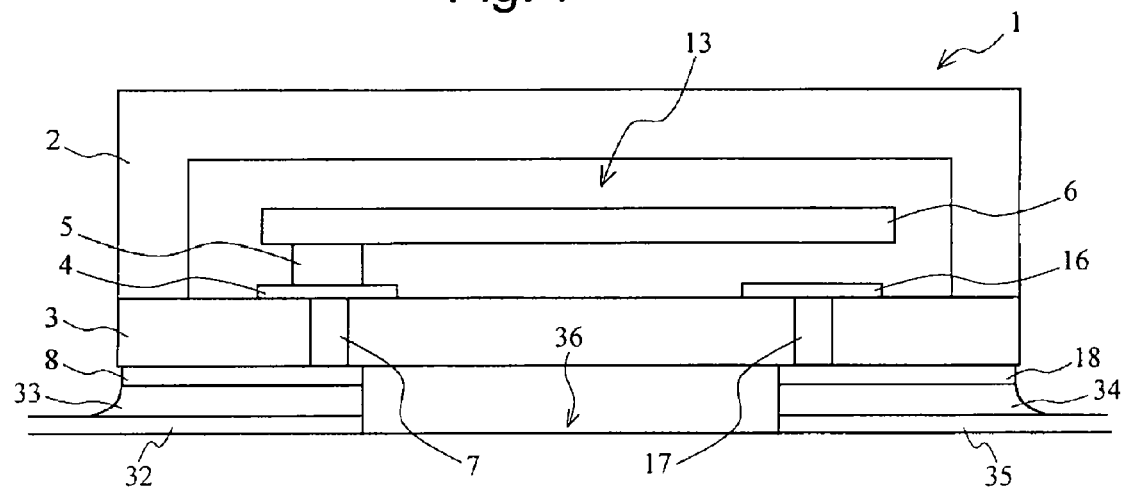
FIG. 7 is a cross-sectional view of the electronic component in a state of being bonded to a circuit board.

FIG. 7 is a view illustrating a cross section of the electronic component 1 in a state of being bonded to the circuit board 36 with the solder 33 and 34. As illustrated in FIG. 7, the outer electrode 8 is electrically and physically bonded to board wiring 32 on the circuit board 36 through the intermediation of the solder 33, while the outer electrode 18 is electrically and physically bonded to board wiring 35 on the circuit board 36 through the intermediation of the solder 34, to thereby connect the electronic component 1 electrically and physically to the circuit board 36.

Figure 8:
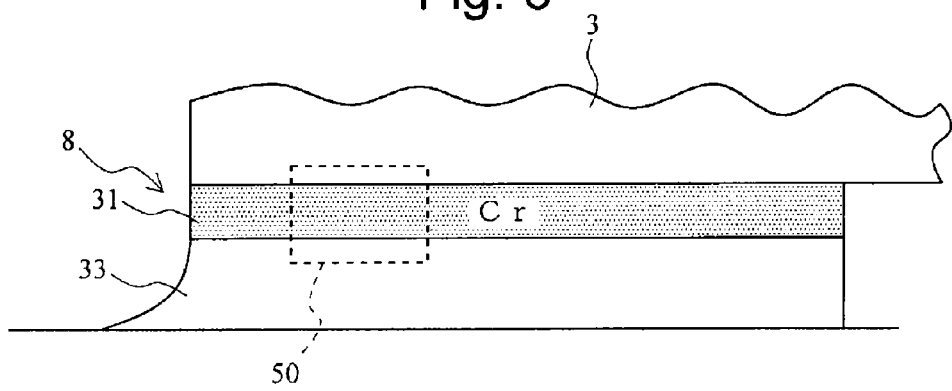
FIG. 8 is a cross-sectional view of the outer electrode of the electronic component in the state of being bonded to the circuit board.

FIG. 8 is a view illustrating a bonding surface of the outer electrode 8 with the solder 33 in detail. The Cr layer as the first layer, that is, Cr of the electrode film for bonding 31 hardly forms an intermetallic compound with solder, and hence is bonded to the solder 33 in a state of being bonded to the base 3. In this way, the electrode film for bonding 31 may be directly bonded to the solder 33 with no intermetallic compound of, for example, Ni and Sn being formed therebetween. The Au layers as the second, fourth, and sixth layers have been dissolved into the solder 33. The Cr layers as the third and fifth layers hardly form an intermetallic compound with solder, and hence after the Au layers as the second and fourth layers have been dissolved, the Cr layers as the third and fifth layers are separated from the outer electrode 8 to remain somewhere in the solder 33. In other words, the anti-oxidation film 51 has been dissolved into the solder 33, and hence is eliminated in FIG. 8. In the case where the anti-oxidation film 51 contains a Cr layer, because the Cr layer hardly forms an intermetallic compound with solder, after the Au layers have been dissolved, the Cr layer is separated from the outer electrode 8 to remain somewhere in the solder 33.

Figures 9, 10:
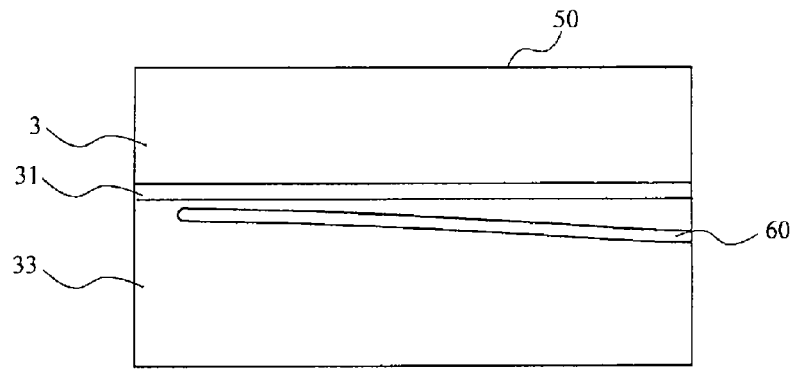
FIG. 9 is an enlarged cross-sectional view of the outer electrode of the electronic component in the state of being bonded to the circuit board.
FIG. 10 is a table for illustrating experiment results.

FIG. 9 is a view schematically illustrating how a region 50 of FIG. 8 is observed under magnification through an analyzer. The region 50 extends over the base 3, the electrode film for bonding 31, and the solder 33, and hence the bonding surface between the electrode film for bonding 31 and the solder 33 and its vicinity are to be observed. Note that, for the simplification of the drawing, FIG. 8 illustrates the electrode film for bonding 31 as being exaggerated in thickness. Accordingly, the electrode film for bonding 31 is observed through the analyzer as such a thin layer as illustrated in FIG. 9.

During the observation of the region 50 for a plurality of times, a strip Cr layer 60 was sometimes observed as being released to be free in the solder 33 as illustrated in FIG. 9. The reason is as follows. The Au layers of the anti-oxidation film 51 are dissolved into the solder 33, whereas because Cr forms no intermetallic compound with Sn, which is a main component of the solder 33, the Cr layer 60 is regarded as one of the Cr layers of the anti-oxidation film 51, which have been released to be free in the solder 33.

As described above, because Cr forms no intermetallic compound with Sn, the Cr layers of the anti-oxidation film 51 are expected to remain in the solder 33 as being torn into strips like the Cr layer 60, or to remain therein as finer pieces of Cr or grains of Cr. Further, there is another possibility that the Cr layers of the anti-oxidation film 51 may cause other reactions or exhibit grain growth. As revealed from results of experiments described later, a solder joint surface of the electronic component 1 exhibits high shear strength and bending resistance. The reason is considered that, regardless of the film formation manner, the Cr layers of the anti-oxidation film 51, which have been released to be free in the solder 33, take some kind of action to have an influence on mechanical characteristics of the solder joint surface of the electronic component 1.

FIG. 10 summarizes results of an experiment regarding shear strength of the outer electrode 8 in the form of table. This experiment is performed on the anti-oxidation film 51 illustrated in FIG. 6, which is formed of a single Au layer. In the item "electrode film structure", each film thickness of a Cr layer (electrode film for bonding 31) and an Au layer (anti-oxidation film 51) is represented by [nm]. For example, "Cr60-Au75" represents a case where the Cr layer of the electrode film for bonding 31 has a thickness of 60 [nm], and the Au layer of the anti-oxidation film 51 has a thickness of 75 [nm]. The shear testing method conforming to JIS Z 3198-7 was employed, and a shear rate was set to 5 [mm/m].

Figures 11, 12:
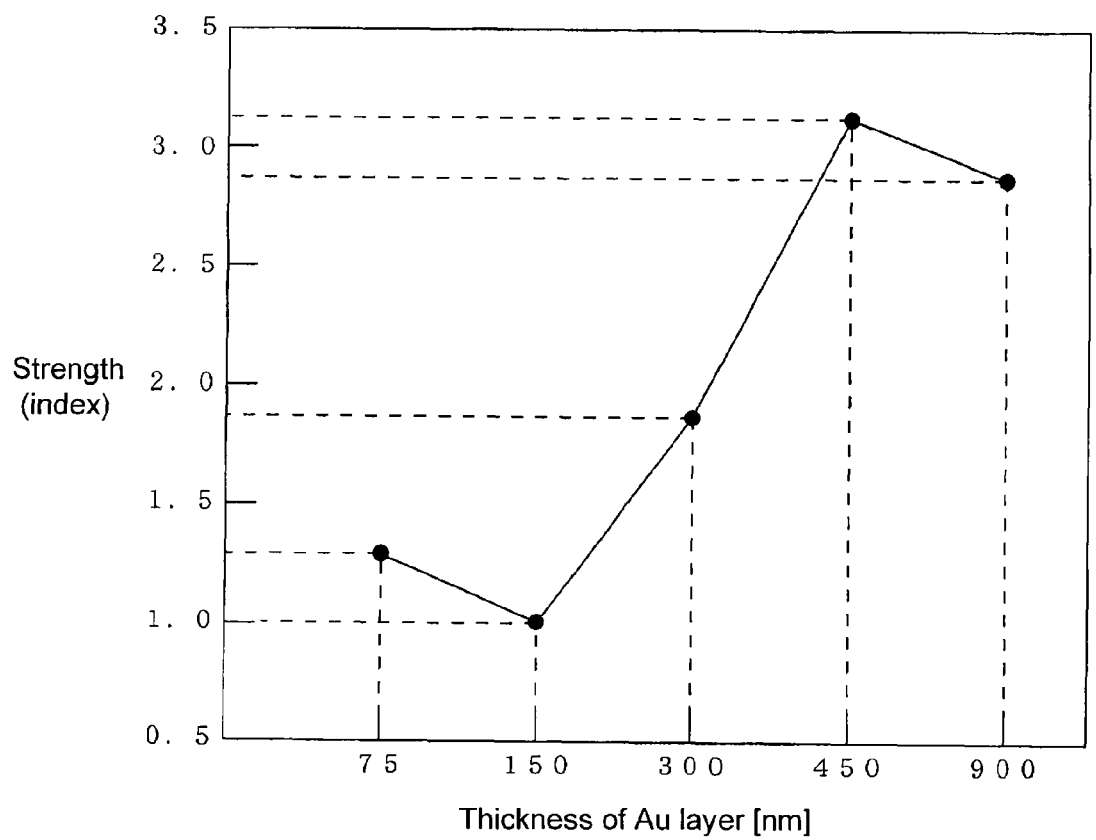
FIG. 11 is a graph for illustrating the experiment results.
FIG. 12 is a table for illustrating experiment results.

In the item "thickness of Au layer", the thickness of the Au layer forming the anti-oxidation film 51 is represented by [nm]. The item "strength (index)" indicates an index representing a ratio of corresponding shear strength with respect to shear strength of 1 obtained in the case where the thickness of the Au layer is 150 [nm]. FIG. 11 is a graph obtained by plotting the indexes.

As apparent from the table and the graph, in the case where the thickness of the Au layer falls within a range of from 75 to 150 [nm], the shear strength is about 1. In contrast, in the case where the thickness of the Au layer falls within a range of from 300 to 900 [nm], the shear strength takes a value of about 2 to 3, which is enough for practical use. An experimental value in the case where the thickness of the Au layer is 1,000 [nm] is not prepared, but is considered to approximate 900 [nm] on the basis of continuity of data. Note that it is commonly known that a soldered portion becomes brittle as an amount of gold becomes larger, and hence the brittleness is expected to be revealed when the Au layer has a thickness of 1,000 [nm] or more. Accordingly, a thickness of the gold layer suitable to practical use corresponds to a thickness of 300 [nm] or more and 1,000 [nm] or less. Further, the results of the experiment show that a peak appears at 450 [nm], and hence a preferable value is 300 [nm] or more and 450 [nm] or less.

Figures 13, 14:
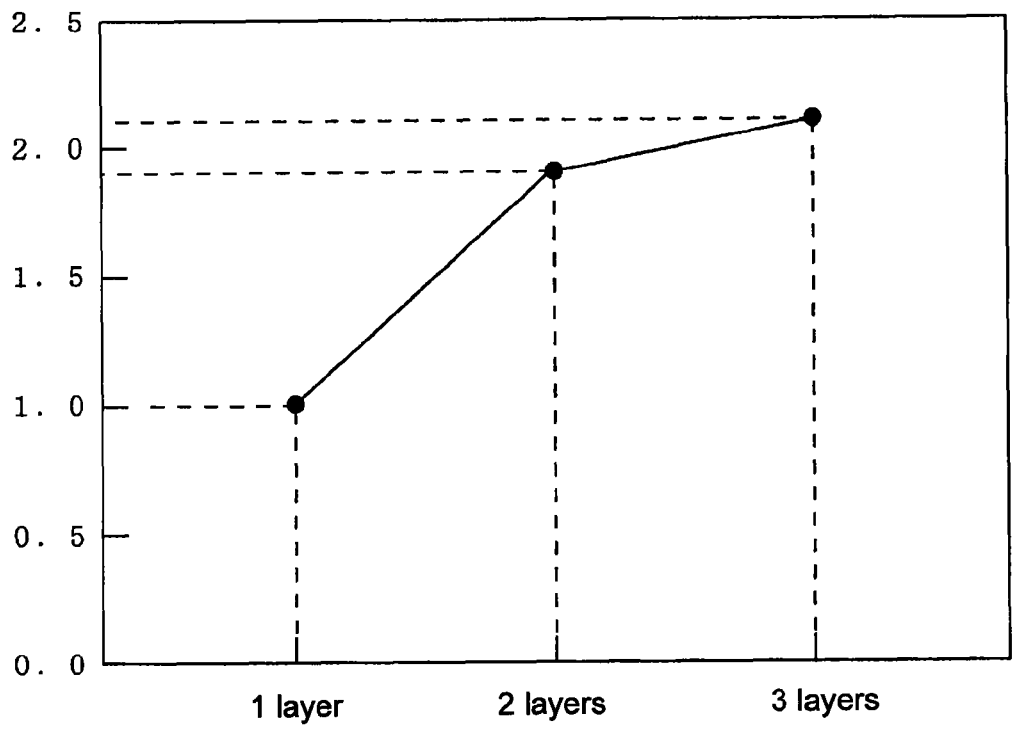
FIG. 13 is a graph for illustrating the experiment results.
FIG. 14 is a table for illustrating experiment results.

FIG. 12 summarizes results of another experiment regarding shear strength of the outer electrode 8 in the form of table, and FIG. 13 is a graph obtained by plotting the results. The shear testing method conforming to JIS Z 3198-7 was employed, and a shear rate was set to 5 [mm/m]. Electrode specifications were made such that a thickness of the Cr layer was 60 [nm] and a thickness of the Au layer was 150 [nm]. In this experiment, there are prepared a single layer (one layer), two layers, and three layers of the gold layers having a thickness of 150 [nm] of the anti-oxidation film 51, and measurement results are expressed by indexing with shear strength obtained in the case of the single layer being 1. In the case where the two or three layers of the Au layers, Cr layers are formed between those Au layers. In other words, there are prepared a single layer, two layers, and three layers of CrAu layers, and measurement results are expressed by indexing with shear strength obtained in the case where the single layer of the CrAu layer being 1.

The results of the experiment show that, in the case where a total thickness of the Au layers is 300 [nm] or more, that is, in the cases of the two and three layers of the Au layers, the respective shear strength is 1.9 and 2.1, which approximate 2 at a practicable level. In other words, when the shear strength obtained in the case where only a single CrAu layer is formed is 1.0, respective shear strength obtained in the cases of the two and three layers thereof is 1.9 and 2.1. Those values are respectively determined through averaging of values obtained by ten times of experiments on the respective layers. As described above, in the case of the two or three CrAu layers, the shear strength is realized which is about twice as much as the shear strength obtained in the case of the single CrAu layer. When the number of CrAu layers was further increased, the highest shear strength may be expected if the number of CrAu layers is two to four, preferably three.

FIG. 14 illustrates results of an experiment in the form of table, showing resistance to board bending. The bending test method conforming to JEITA ET-7409/104 was employed in which a glass epoxy circuit board with a thickness of 1.6 [mm] was used and judgment was made as to whether cracks were visually observed or not at an indentation of 1, 2, or 3 [mm]. The item "electrode specifications" indicates specifications of the electrode, and shows a case of an electrode that includes a Cr layer having a thickness of 60 [nm] as the electrode film for bonding 31 and three layers of Au layers each having a thickness of 150 [nm] as the anti-oxidation film 51 (corresponding to a case of the outer electrode 8 formed of three layers of Au layers), that is, a case of the outer electrode 8 formed by laminating three layers of CrAu layers in which a thickness of a Cr layer is 60 [nm] and a thickness of an Au layer is 150 [nm]. The item "electrode specifications" shows another case of an electrode (first comparison electrode) that includes a Cr layer having a thickness of 60 [nm], a Cu layer having a thickness of 10,500 [nm], and an Sn layer having a thickness of 10,000 [nm], and shows still another case of an electrode (second comparison electrode) that includes a Cr layer having a thickness of 60 [nm], a Cu layer having a thickness of 500 [nm], an Ni layer having a thickness of 2,000 [nm], and an Sn layer having a thickness of 10,000 [nm].

Those electrodes were each formed in the electronic component 1 and bonded to the circuit board 36, and then the circuit board 36 was pushed by a pushing mechanism. At the indentation of 1 [mm], cracks were generated in the outer electrode 8 zero times out of twenty times, in the first comparison electrode once out of five times, and in the second comparison electrode zero times out of five times. At the indentation of 2 [mm], cracks were respectively generated zero times out of twenty times, four times out of five times, and twice out of five times in the electrodes. At the indentation of 3 [mm], cracks were respectively generated zero times out of twenty times, four times out of five times, and four times out of five times in the electrodes.

Regarding the electronic component 1 having the outer electrode 8 formed therein, no crack was generated at any of those indentations, and high bending resistance is exhibited compared with the first comparison electrode and the second comparison electrode. As described above, superior shear strength and bending resistance may be realized in the outer electrode 8 that is formed by laminating a CrAu layer three times. The reason why such an outer electrode 8 formed by laminating a CrAu layer three times exhibits superior shear strength and bending resistance is expected as follows.

Specifically, in the case of the outer electrode 8 illustrated in FIG. 3, the Au layers as the second, fourth, and sixth layers have been dissolved into solder, and accordingly the Cr layers as the third and fifth layers are released from the outer electrode 8 to be free. The Cr layers, which have been released to be free, form no compound with solder, and hence are not dissolved into solder but remain in solder to thereby serve as a reinforcing member that reinforces solder. When the inventors of the present invention used an analyzer or the like to make an investigation on in what state a separated Cr layer remained in solder, a strip Cr layer was sometimes found in the vicinity of the outer electrode 8 through the region of solder.

As described above, the Cr layer, which has been released to be free, is expected to remain as being torn into strips, or to remain as finer pieces of Cr or still finer grains of Cr. Further, there is another possibility that the Cr layer may cause other reactions or exhibit grain growth. In any case, the Cr layer, which has been separated to remain in solder, takes some kind of action to have an influence on mechanical characteristics of a solder joint surface of the outer electrode 8 so that the solder joint surface may exhibit high shear strength and bending resistance. It is further expected that such effects result from contributions of Au that have been dissolved into solder.

Further, the outer electrode 8 concerned has the total thickness value of the Au layers of 450 [nm], and hence superior bending resistance is realized. In such a case where the thickness of the Au layers forming the anti-oxidation film 51 is 300 [nm] or more and 1,000 [nm] or less, shear strength or the like of the outer electrode 8 is improved. The reason is considered that, as the Au layer becomes thickened, anti-oxidation ability of Cr of the electrode film for bonding 31 becomes improved. It is further considered that, in the case of a multi-layer structure of the Au layers of the anti-oxidation film 51, the strength is further improved because Cr layers interposed between those Au layers become fine-grained when mixed or contained in the solder.

Note that it may be difficult to solder a Cr layer in air in the case of a thin film of an Au layer. However, if the Au layer has a thickness of 300 [nm] or more, the anti-oxidation function of the Cr layer is improved so that soldering (reflow) may be performed in air. As a result, there is no need to prepare a special atmosphere for soldering, which reduces soldering cost.

Figure 15:
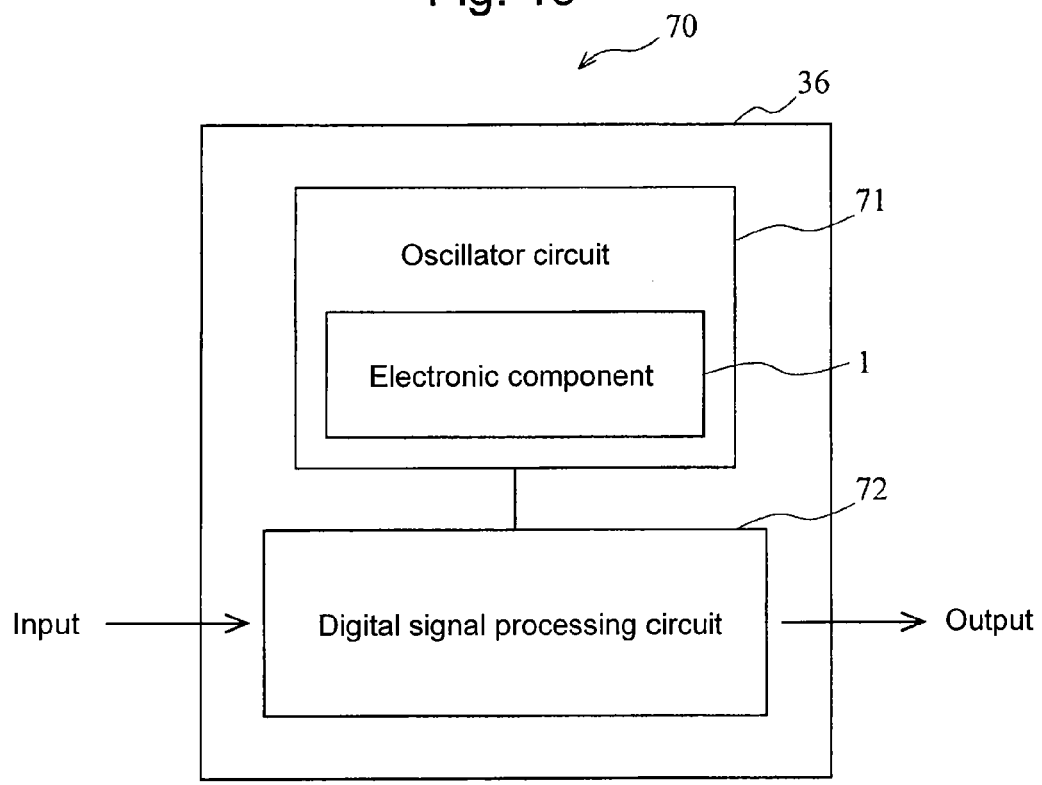
FIG. 15 is an explanatory diagram of a configuration of an electronic device.
Figure 16:
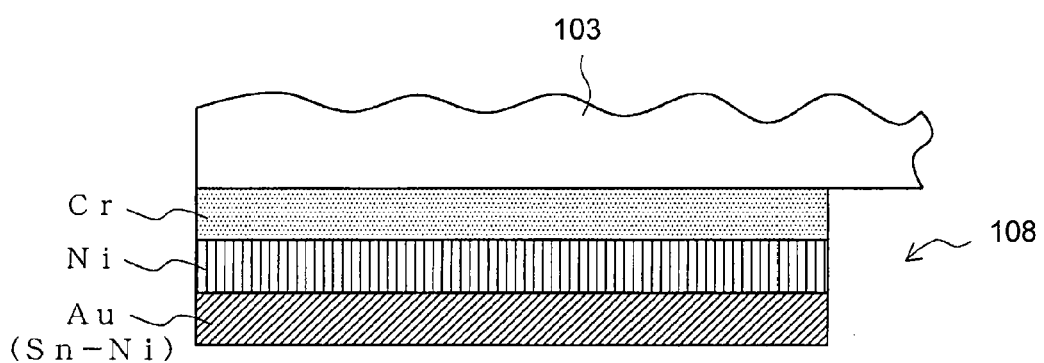
FIG. 16 is an explanatory view of a conventional example.

FIG. 15 is an explanatory diagram of a configuration of an electronic device 70 that includes the electronic component 1 mounted onto the circuit board 36. The electronic component 1 is soldered onto the circuit board 36, and constitutes an oscillator circuit 71 together with electronic elements (not shown), such as a coil and a capacitor. A digital signal processing circuit 72 is constituted by, for example, a central processing unit (CPU), a read only memory (ROM), a random access memory (RAM), and other electronic elements, which are mounted onto the circuit board 36. The digital signal processing circuit 72 performs digital signal processing on its input in accordance with an operation timing generated by the oscillator circuit 71, and outputs the resultant signal.

The electronic device 70 is applicable to various modes including a desktop electronic calculator, an electronic dictionary, a mobile phone, a personal computer, a television set, a radio set, and control devices for home appliances, such as an air conditioner and a refrigerator. In addition, the electronic device 70 is also applicable to a timepiece or a timer, which measures a time period utilizing the oscillation of the electronic component 1.

According to this embodiment described above, there may be provided an electronic component (electronic component 1) including an electronic element (such as the crystal resonator 6, or a semiconductor is also available), a housing case (package formed of the lid 2 and the base 3) for housing the electronic element in a hollow portion (hollow portion 13) defined inside the housing case, via electrodes (such as the inner electrodes 4 and 16 and the through electrodes 7 and 17) that are electrically connected to the electronic element, the via electrodes being formed from an inside of the housing case to an outside of the housing case, and outer electrodes (outer electrodes 8 and 18) that are electrically connected to the via electrodes, the outer electrodes being formed on a bottom surface of the housing case. The outer electrodes (outer electrodes 8 and 18) are each formed by using a first metal layer (such as a Cr layer) that is formed on the bottom surface of the housing case (bottom surface of the base 3) and is to be bonded to solder, a second metal layer (such as an Au layer) that is formed on a surface of the first metal layer and is to be dissolved into solder, and a third metal layer (such as a Cr layer) that is formed on a surface of the second metal layer and is to be hardly dissolved into solder. If another Au layer for preventing oxidation is formed on the surface, the resultant structure corresponds to a structure in which a CrAu layer is laminated repeatedly twice. If another CrAu layer is further laminated thereon, the resultant structure corresponds to a structure in which a CrAu layer is laminated repeatedly three times. Note that an alloy of a plurality of metals may be used as a metal layer.

The first and third metal layers each use a metallic element that hardly forms an intermetallic compound with solder, while the second metal layer uses a metallic element that forms an intermetallic compound with solder. Accordingly, it may also be said that the outer electrodes (outer electrodes 8 and 18) are each formed by using a first metal layer (such as a Cr layer) that is formed on the bottom surface of the housing case (bottom surface of the base 3) and is to hardly form an intermetallic compound with solder, a second metal layer (such as an Au layer) that is formed on a surface of the first metal layer and is to form an intermetallic compound with solder, and a third metal layer (such as a Cr layer) that is formed on a surface of the second metal layer and is to hardly form an intermetallic compound with solder.

The outer electrodes 8 and 18 may each be formed by further including a fourth metal layer (such as an Au layer) that is formed on a surface of the third metal layer and is to be dissolved into solder, and a fifth metal layer (such as a Cr layer) that is formed on a surface of the fourth metal layer and is to be hardly dissolved into solder. Further, an Au layer may be formed as an anti-oxidation film that constitutes the outermost surface layer.

Further, the electronic component 1 may be manufactured by a manufacturing method for an electronic component, including an electronic element installing step of installing, on a base (base 3), an electronic element (such as the crystal resonator 6) and via electrodes (such as the through electrodes 7 and 17) for wiring to be electrically connected to the electronic element, an enclosing step of bonding a lid (lid 2) to the base on which the electronic element and the via electrodes are installed, to thereby enclose the electronic element in a housing case including the base and the lid, and an outer electrode forming step of, by a sputtering method or the like, forming, on a bottom surface of the housing case, a first metal layer (Cr layer) that is to be bonded to solder, forming, on a surface of the first metal layer, a second metal layer (Au layer) that is to be dissolved into solder, and forming, on a surface of the second metal layer, a third metal layer (Cr layer) that is to be hardly dissoved into solder, to thereby form an outer electrode.

Still further, according to this embodiment described above, there may be provided an electronic component including an electronic element (such as the crystal resonator 6, or a semiconductor is also available), a housing case (package formed of the lid 2 and the base 3) for housing the electronic element in a hollow portion (hollow portion 13) defined inside the housing case, via electrodes (such as the inner electrodes 4 and 16 and the through electrodes 7 and 17) that are electrically connected to the electronic element, the via electrodes being formed from an inside of the housing case to an outside of the housing case, a metal film for bonding (electrode film for bonding 31) that is electrically connected to one of the via electrodes and is to be bonded to solder, the metal film for bonding being formed on a bottom surface of the housing case, and an anti-oxidation film (anti-oxidation film 51) that is formed on a surface of the metal film for bonding. The anti-oxidation film includes at least one gold layer (Au layer) having a total thickness of 300 nm or more and 1,000 nm or less. The uppermost layer of the anti-oxidation film 51 is formed of an Au layer, and hence the uppermost surface of the gold layer is bonded to the metal film for bonding.

A total thickness of the Au layers of the anti-oxidation film 51 may be preferably set to 300 [nm] or more and 450 [nm] or less. In a case where the anti-oxidation film 51 is formed of a plurality of Au layers, a metal layer that is hardly dissolved into solder, such as a Cr layer, may be formed between the plurality of Au layers. Accordingly, the anti-oxidation film may include a plurality of gold layers, and a predetermined metal layer that is formed between the plurality of the gold layers. The predetermined metal layer may be made of a metal that is hardly dissolved into solder. Further, the Au layers may be formed as a single layer. In this case, the anti-oxidation film includes the gold layers formed as a single layer. Still further, the base 3 may be formed of glass. In this case, the housing case of the electronic component is formed using glass.

Still further, according to this embodiment described above, there may be provided a manufacturing method for an electronic component, including an electronic element installing step of installing, on a base (base 3), an electronic element (such as the crystal resonator 6) and via electrodes (such as the through electrodes 7 and 17) for wiring to be electrically connected to the electronic element, an enclosing step of bonding a lid (lid 2) to the base on which the electronic element and the via electrodes are installed, to thereby enclose the electronic element in a housing case including the base and the lid, a metal film for bonding forming step of forming, on a bottom surface of the housing case by a sputtering method or the like, a metal film for bonding (electrode film for bonding 31) that is to be bonded to solder, and an anti-oxidation film forming step of forming, on a surface of the formed metal film for bonding, an anti-oxidation film (anti-oxidation film 51) that includes at least one gold (Au) layer having a total thickness of 300 [nm] or more and 1,000 [nm] or less, the at least one gold layer having an uppermost surface bonded to the formed metal film for bonding.

Further, the electronic component 1 is bonded to the circuit board 36 to constitute an oscillator circuit together with other electronic elements, such as a capacitor and a coil, so as to be used for a computer to acquire a operation timing or for a timepiece to measure a time period utilizing the oscillation. Therefore, there may be provided various kinds of electronic devices including oscillating means (oscillator circuit) that oscillates utilizing an electronic component, and operating means (such as a central processing unit (CPU)) that operates in response to an operation timing acquired by utilizing the oscillation of the oscillating means.

In this case, there is constituted an electronic device including an electronic element (such as the crystal resonator 6), a housing case (package formed of the lid 2 and the base 3) for housing the electronic element in a hollow portion defined inside the housing case, via electrodes (such as the through electrodes 7 and 17) that are electrically connected to the electronic element, the via electrodes being formed from an inside of the housing case to an outside of the housing case, a metal layer (Cr (first layer)) that is electrically connected to one of the via electrodes, the metal layer being formed on a bottom surface of the housing case and bonded to solder, that is, a metal film for bonding, and a circuit board (circuit board 36) on which other electronic elements are provided while being bonded to the metal layer (metal film for bonding) through the intermediation of the solder. In the solder, a metal (Cr of the third and fifth layers) that is hardly dissolved into solder is separated and dispersed.

Still further, according to this embodiment described above, there may be provided an electronic device including an electronic element (such as the crystal resonator 6, or a semiconductor is also available), a housing case (package formed of the lid 2 and the base 3) for housing the electronic element in a hollow portion (hollow portion 13) defined inside the housing case, via electrodes (such as the inner electrodes 4 and 16 and the through electrodes 7 and 17) that are electrically connected to the electronic element, the via electrodes being formed from an inside of the housing case to an outside of the housing case, an electrode metal layer (metal film for bonding 31) that is electrically connected to one of the via electrodes, the electrode metal layer being formed on a bottom surface of the housing case, a joint (solder 33) that is directly bonded to the metal film for bonding 31 with no intermetallic compound layer with Sn (intermetallic compound layer of Sn and the electrode metal layer), such as an intermetallic compound of Sn and Ni, being formed between the joint and the electrode metal layer, and a circuit board 36 on which other electronic elements, such as a capacitor and a coil, are provided while being connected to the joint.

As a material of the electrode film for bonding 31, Cr, Ti, Mo, W, or Ta may be used, and hence the electrode metal layer (electrode film for bonding 31) may be made of a metal selected from the group consisting of Cr, Ti, Mo, W, and Ta.

Further, in a case where the anti-oxidation film 51 includes a Cr layer, when the anti-oxidation film 51 is soldered, Cr is contained in the solder 33 in a mixed state, and a Ti layer, an Mo layer, a W layer, or a Ta layer may be used in place of the Cr layer. Accordingly, the solder 33 after soldering may contain in a mixed state at least one metal selected from the group consisting of Cr, Ti, Mo, W, and Ta.

In a case where the metal layer of the electrode film for bonding 31 and the metal layer of the anti-oxidation film 51 are formed of the same material, such as a case where the electrode film for bonding 31 is formed of a Cr layer while the anti-oxidation film 51 is formed of an Au layer and a Cr layer, or a case where the electrode film for bonding 31 is formed of a Ti layer while the anti-oxidation film 51 is formed of an Au layer and a Ti layer, the electrode film for bonding 31 and the anti-oxidation film 51 may be formed by alternately forming the corresponding metal layer and the Au layer, which simplifies its manufacturing process and reduces its manufacturing cost. In the case of soldering the outer electrode 8 in which the metal layer of the electrode film for bonding 31 and the metal layer of the anti-oxidation film 51 are made of the same metal as described above, the same metal as in the electrode film for bonding 31 is contained in the solder 33 in a mixed state. In this case, the electrode metal layer (electrode film for bonding 31) is made of the same metal as that contained in the above-mentioned solder (solder 33) in the mixed state.

According to this embodiment described above, the following effects may be obtained.

(1) Metal layers are laminated so that a metal layer formed on a bottom surface of the base 3 may become resistant to oxidation, and hence mounting strength of the electronic component 1 is increased, resulting in superior repairability.

(2) Formed on the electrode film for bonding 31 are Au layers having a total thickness value falling within a predetermined range, and hence the electrode film for bonding 31 becomes resistant to oxidation, and solder is prevented from becoming brittle due to an excessive amount of Au. As a result, mounting strength of the electronic component 1 is increased.

(3) A Cr layer of the electrode film for bonding 31 is directly bonded to the solder 33 with no intermetallic compound layer, such as an intermetallic compound of Sn and Ni, being formed therebetween, and hence a problem of brittleness caused by an intermetallic compound layer may be avoided.

(4) The anti-oxidation film 51 is formed by alternately laminating a metal layer that hardly forms an intermetallic compound with solder, such as a Cr layer, and a metal layer that is dissolved into solder, such as an Au layer. Accordingly, mounting strength and bending resistance of a solder joint surface is improved because the metal layer that hardly forms an intermetallic compound with solder in soldering of the outer electrode 8 may be contained in the solder 33 in a mixed state in, for example, a strip shape.

(5) An Au layer has the high anti-oxidation function, and hence the electronic component 1 may be soldered in air.

(6) An Au layer is dissolved uniformly into solder so that a joint interface of Cr and Sn may be obtained in the outer electrode 8. Under a temperature range (up to 260° C.) of reflow or high temperature test, Cr and Sn hardly show alloy formation and growth, resulting in superior heat resistance and impact resistance.

(7) There is no growth of an alloy of Cr and solder, and hence a thickened Cr layer does not need to be formed. Therefore, film stress may be suppressed to be small, resulting in superior resistant to board bending.

(8) In a case where Cr-Au is used for the inner electrodes 4 and 16 and the like, an apparatus may be shared in the formation of the outer electrodes 8 and 18. Besides, if the film thickness of internal layers are made the same as the film thickness of external layers, there is no need to change conditions in the apparatus, which reduces equipment investment to increase productivity.

(9) There may be employed a glass package, which is inexpensive and transparent, though being brittle and low in strength compared with ceramics or the like.

(10) In a case where there is provided a step portion in the formation region of the outer electrode 8, a risk of disconnection may be reduced by laminating a Cr layer and an Au layer.

(11) The outer electrode 8 may be formed by a sputtering method, and hence a metal layer may be formed in a dry atmosphere, to thereby prevent elusion of the through electrode 7 and the like.

(12) There is realized a high-quality glass package in which mounting strength, repairablility, heat resistance, and resistance to board bending are made compatible.

What is claimed is:
1. An electronic component mounted on a circuit board including electrodes thereon, the electronic component comprising:
an electronic element including electrodes; and
a housing case for housing the electronic element in a hollow portion defined inside the housing case, the housing including
via electrodes electrically connected to the electrodes of the electronic element,
the via electrodes extending from an inside of the housing case to an outside of the housing case, and
outer electrodes electrically connected to the via electrodes and attached to the circuit board by a metallic solder,
the outer electrodes on a bottom surface of the housing case,
wherein the outer electrodes comprise:
a first metal layer on the bottom surface of the housing case and connected to the electrodes on the circuit board by the metallic solder;
a second metal layer on a surface of the first metal layer and comprising a solder-soluble metal; and a third metal layer on a surface of the second metal layer and comprising non-solder-soluble metal in which mobile portions of the third metal are entrained in the metallic solder and increase the shear strength of the connection between the outer electrodes and the electrodes on the circuit board.

2. An electronic component according to claim 1, wherein the outer electrodes are each formed by further including:
a fourth metal layer on a surface of the third metal layer and comprising a solder-soluble metal; and
a fifth metal layer on a surface of the fourth metal layer and comprising a non-solder-soluble metal.

3. An electronic component according to claim 1, wherein the outer electrodes each further include an outermost surface layer comprising an anti-oxidation film.

4. An electronic component according to claim 1, wherein the housing case comprises glass.

5. An electronic component according to claim 1, wherein the electronic element comprises a crystal resonator.

6. A manufacturing method for an electronic component, comprising:
an electronic element installing step of installing, on a base, an electronic element and via electrodes for wiring to be electrically connected to electrodes of the electronic element;
an enclosing step of bonding a lid to the base on which the electronic element and the via electrodes are installed, to thereby enclose the electronic element in a housing case including the base and the lid; and
an outer electrode forming step of:
forming, on a bottom surface of the housing case, a first metal layer that is to be soldered to;
forming, on a surface of the first metal layer, a second metal layer that is to be dissolved into solder; and
forming, on a surface of the second metal layer, a third metal layer that is to be hardly dissolved into solder, to thereby form an outer electrode.

7. An electronic component mounted on a circuit board, the electronic component comprising:
an electronic element including electrodes;
a housing case for housing the electronic element in a hollow portion defined inside the housing case, the housing case including
via electrodes electrically connected to the electrodes of the electronic element,
the via electrodes extending from an inside of the housing case to an outside of the housing case;
a metal bonding film electrically connected to one of the via electrodes and soldered to electrodes of the circuit board by a metallic solder,
the metal bonding film on a bottom surface of the housing case; and
an anti-oxidation film that on a surface of the metal film for bonding,
wherein the anti-oxidation film includes at least one gold layer having a total thickness of 300 nm or more and 1,000 nm or less so as to substantially prevent, oxidation of the metal bonding film, and
wherein an uppermost surface of the at least one gold layer is bonded to the metal bonding film.

8. An electronic component according to claim 7, wherein the total thickness of the at least one gold layer is 300 nm or more and 450 nm or less.

9. An electronic component according to claim 7, wherein the anti-oxidation film includes:
a plurality of the gold layers; and
a predetermined metal layer between the plurality of the gold layers.

10. An electronic component according to claim 9, wherein the predetermined metal layer comprises a non-solder soluble metal.

11. An electronic component according to claim 7, wherein the anti-oxidation film includes the at least one gold layer comprising a single layer.

12. An electronic component according to claim 7, wherein the housing case comprises glass.

13. An electronic component according to claim 7, wherein the electronic element comprises a crystal resonator.

14. A manufacturing method for an electronic component, comprising:
an electronic element installing step of installing, on a base, an electronic element and via electrodes for wiring to be electrically connected to electrodes of the electronic element;
an enclosing step of bonding a lid to the base on which the electronic element and the via electrodes are installed, to thereby enclose the electronic element in a housing case including the base and the lid;
a metal film for bonding forming step of forming, on a bottom surface of the housing case, a metal film for bonding that is to be soldered to; and
an anti-oxidation film forming step of forming, on a surface of the formed metal film for bonding, an anti-oxidation film that includes at least one gold layer having a total thickness of 300 nm or more and 1,000 nm or less, the at least one gold layer having an uppermost surface bonded to the formed metal film for bonding.

* * * * *